(12) United States Patent
Manabe et al.

(10) Patent No.: US 8,646,926 B2
(45) Date of Patent: Feb. 11, 2014

(54) LED MODULE, LED LAMP, AND ILLUMINATING APPARATUS

(75) Inventors: Yoshio Manabe, Osaka (JP); Atsushi Motoya, Shiga (JP); Toshio Mori, Hyogo (JP); Ikuko Aoki, Osaka (JP); Hiroshi Yagi, Osaka (JP); Makoto Horiuchi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/393,524

(22) PCT Filed: May 11, 2011

(86) PCT No.: PCT/JP2011/002613
§ 371 (c)(1),
(2), (4) Date: Feb. 29, 2012

(87) PCT Pub. No.: WO2011/142127
PCT Pub. Date: Nov. 17, 2011

(65) Prior Publication Data
US 2012/0155061 A1    Jun. 21, 2012

(30) Foreign Application Priority Data

May 14, 2010    (JP) ................................. 2010-111968

(51) Int. Cl.
*F21V 9/16*    (2006.01)
(52) U.S. Cl.
USPC ............................................. 362/84; 257/98
(58) Field of Classification Search
USPC ................ 362/84, 34, 311.02, 230, 231, 800;
313/483, 498, 501, 502; 257/89, 98,
257/99, E33.061; 428/690, 917
See application file for complete search history.

(56) References Cited

U.S. PATENT DOCUMENTS

| 6,359,380 B1 | 3/2002 | Nishizawa et al. | |
|---|---|---|---|
| 6,940,101 B2 * | 9/2005 | Yano et al. | 257/98 |
| 7,259,400 B1 * | 8/2007 | Taskar | 257/98 |
| 7,682,848 B2 | 3/2010 | Shimizu et al. | |
| 7,753,553 B2 * | 7/2010 | Justel et al. | 362/231 |
| 2004/0119086 A1 * | 6/2004 | Yano et al. | 257/98 |
| 2008/0198573 A1 * | 8/2008 | Justel et al. | 362/84 |

FOREIGN PATENT DOCUMENTS

| CN | 100352069 | 11/2007 |
|---|---|---|
| JP | 2-189888 | 7/1990 |
| JP | 4-370658 | 12/1992 |
| JP | 11-250834 | 9/1999 |
| JP | 2000-11954 | 1/2000 |
| JP | 2003-331795 | 11/2003 |
| JP | 2004-193581 | 7/2004 |
| JP | 2007-116133 | 5/2007 |
| JP | 2010-40558 | 2/2010 |

OTHER PUBLICATIONS

Natatani, Yoshinobu; "Revision of the Chroma and Hue Scales of a Nonlinear Color-Appearance Model", Color Research and Application, vol. 20, Issue 3, Jun. 1995, pp. 143-155.
Chinese Patent Application No. 201180003524.0 Office Action dated Oct. 17, 2012, 7 pages.
Yuan Yisong, "Neodymium Glasses", Glass & Enamel, vol. 12, No. 4, Dec. 31, 1983, 25 pages with Verified English translation.

* cited by examiner

*Primary Examiner* — Bao Q Truong

(57) ABSTRACT

To constrain reductions in luminous efficacy while enhancing the color rendition index, the LED module includes a blue LED, at least one variety of phosphor particles excited by the outgoing light from the blue LED, and neodymium glass particles that include neodymium ions absorbing the outgoing light from the phosphor particles in a predetermined wavelength band.

22 Claims, 16 Drawing Sheets

FIG. 5

| | | Flux | Flux Ratio | Ra | Ga | M | R9 | R15 | Ga4 |
|---|---|---|---|---|---|---|---|---|---|
| S1 | Undoped | 273 | 100 | 76.9 | 94.4 | 109.7 | 1.9 | 71.3 | 95.1 |
| S2 | Nd$_2$O$_3$ particles 0.5% | 226 | 82.8 | 81.6 | 99.6 | 119.0 | 54.3 | 85.0 | 102.1 |
| S3 | Nd$_2$O$_3$ particles 1.0% | 197 | 72.2 | 83.0 | 100.3 | 122.4 | 83.6 | 90.3 | 106.1 |
| S4 | Nd$_2$O$_3$ particles 3.0% | 122 | 44.7 | 75.8 | 104.0 | 132.7 | 46.3 | 94.2 | 114.6 |
| S5 | Nd glass particles 5.0% | 250 | 91.6 | 82.4 | 98.9 | 116.6 | 27.1 | 81.8 | 99.1 |
| S6 | Nd glass particles 7.0% | 235 | 86.1 | 85.9 | 101.8 | 121.7 | 40.9 | 87.2 | 101.6 |
| S7 | Nd glass particles 10.0% | 231 | 84.6 | 87.5 | 103.5 | 124.0 | 51.6 | 91.3 | 103.1 |

FIG. 7

| | Flux Ratio | Tc | Duv | Ra | R9 | R15 | Ga4 |
|---|---|---|---|---|---|---|---|
| Undoped | 100 | 2800 | 0.3 | 74 | -8 | 66 | 92 |
| Nd glass plates | 85 | 2920 | -1.6 | 82 | 36 | 83 | 99 |
| | 80 | 2950 | -2.4 | 85 | 54 | 90 | 102 |
| | 75 | 3000 | -2.7 | 87 | 73 | 96 | 105 |
| Nd glass particles | 90 | 2905 | -1.7 | 79 | 23 | 78 | 97 |
| | 85 | 2951 | -2.9 | 83 | 41 | 85 | 100 |
| | 82 | 2981 | -3.6 | 85 | 52 | 90 | 102 |
| | 80 | 3003 | -4.1 | 86 | 61 | 93 | 104 |
| | 75 | 3068 | -5.5 | 89 | 84 | 97 | 107 |

FIG. 10

| Sample | | Flux | Flux Ratio | Ra | Ga | M | R9 | R15 | Ga4 |
|---|---|---|---|---|---|---|---|---|---|
| S11 | Undoped | 403 | 100 | 76.4 | 91.2 | 94.9 | 0.5 | 73.1 | 92.2 |
| S12 | Nd₂O₃ particles 0.5% | 343 | 85.1 | 76.2 | 92.5 | 95.9 | 39.7 | 79.5 | 97.3 |
| S13 | Nd₂O₃ particles 1.0% | 301 | 74.7 | 73.3 | 87.5 | 95.2 | 37.9 | 72.2 | 95.7 |
| S14 | Nd₂O₃ particles 3.0% | 188 | 46.7 | 67.3 | 84.4 | 99.2 | 65.2 | 68.4 | 98.2 |
| S15 | Nd glass particles 5.0% | 376 | 93.4 | 80.1 | 95.2 | 97.8 | 31.7 | 83.8 | 97.1 |
| S16 | Nd glass particles 7.0% | 350 | 87.0 | 82.6 | 98.0 | 103.5 | 48.3 | 89.1 | 100.1 |
| S17 | Nd glass particles 10.0% | 348 | 86.5 | 82.5 | 98.6 | 102.6 | 57.0 | 91.4 | 101.3 |

5a

5b

5c

1a

1b

1c

1d

1e

1f

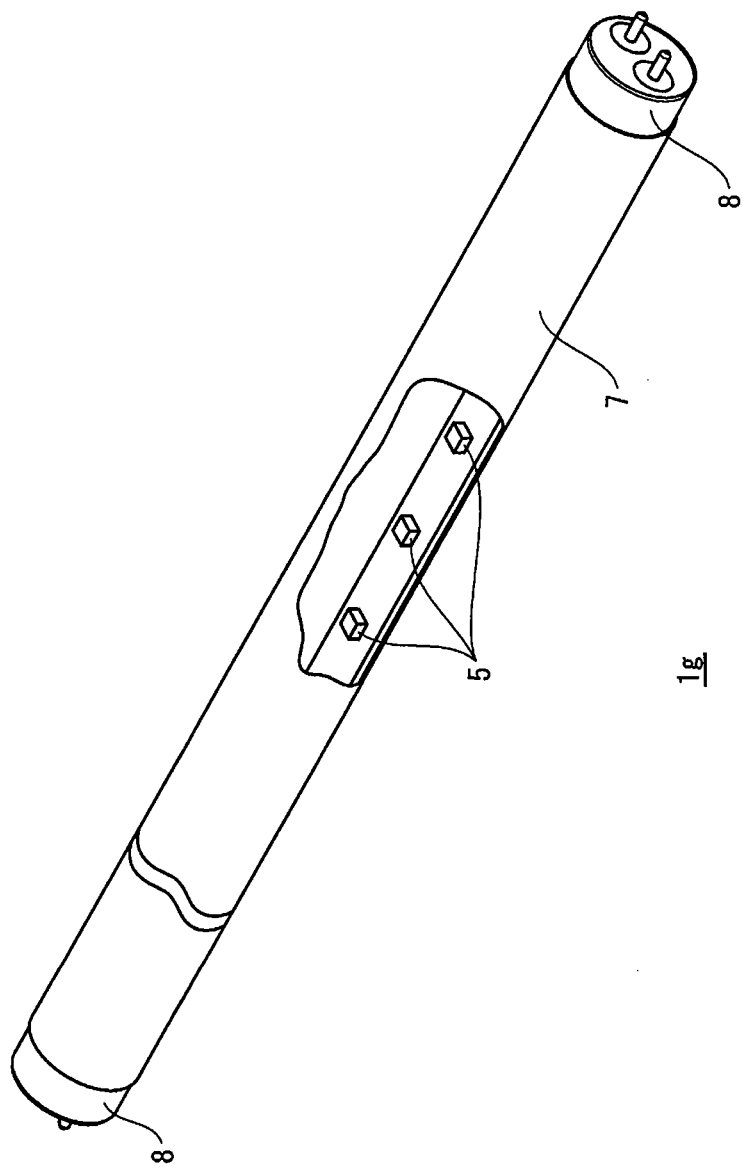

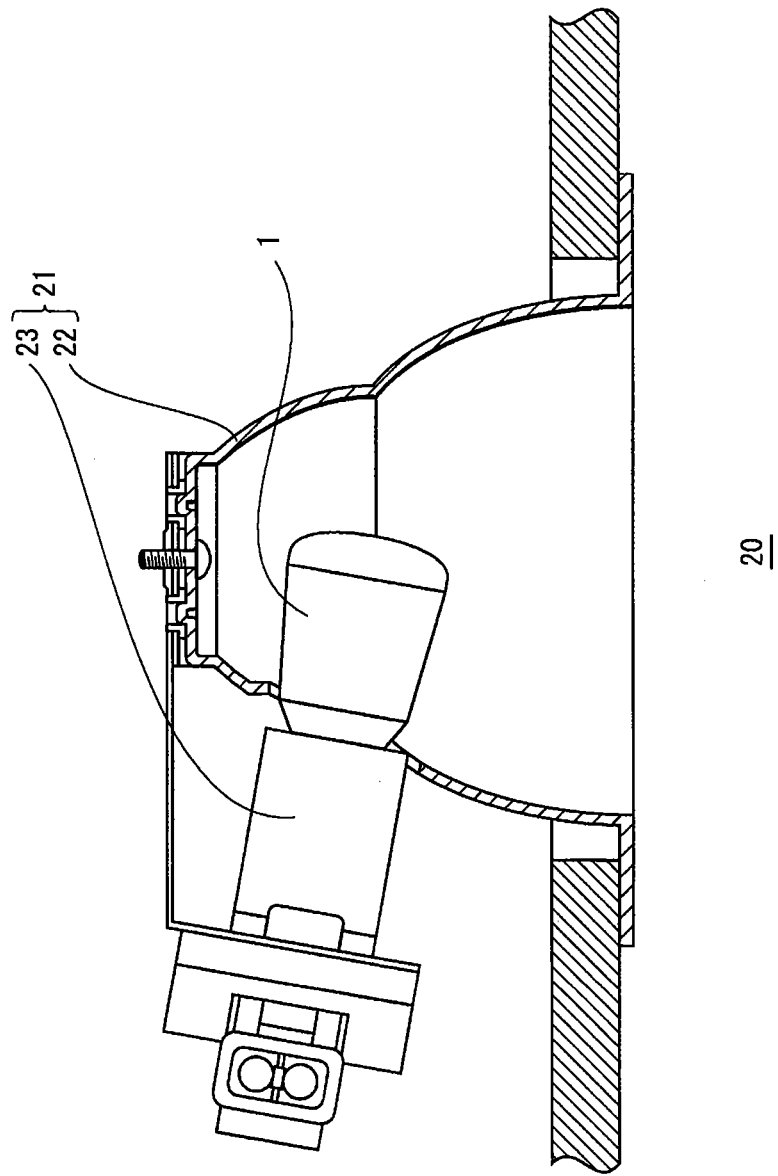

LED MODULE, LED LAMP, AND ILLUMINATING APPARATUS

TECHNICAL FIELD

The present invention pertains to an LED module, LED lamp, and illuminating apparatus, and particularly pertains to technology for improving the color rendering index and luminous efficacy thereof.

BACKGROUND ART

In recent years, LED lamps have been widely used as a superb energy-conscious replacement for incandescent light bulbs. The LED module used in an LED lamp is often, for example, a gallium nitride (GaN) blue LED used in combination with YAG yellow phosphor. Such an LED module produces blue light from the blue LED, which excites the yellow phosphor particle, which in turn produce yellow light. Combined, the blue light and the yellow light result in white light.

Typically, in the field of lighting, objects viewed under a light source should preferably appear to have natural coloring. In other words, a better color rendering index is valued highly. Various conventional technologies have been proposed for enhancing the color rendering index of LED lamps. For example, Patent Literature 1 proposes mixing neodymium oxide ($Nd_2O_3$) particles into resin or the like for a filter element attached to the LED lamp as a means of improving average color rendering index Ra. Also, Patent Literature 2, which describes a fluorescent lamp, proposes forming a glass thin-film filter that incorporates neodymium ions ($Nd^{3+}$) in the space between a glass tube and a phosphor layer, as a means of improving the color rendering index.

Japanese Industrial Standard Z8726 defines methods for quantitatively evaluating the color rendering index under a light source by using color rendering indices indicating color reproduction fidelity in comparison to a reference light source.

CITATION LIST

Patent Literature

[Patent Literature 1]
  Japanese Patent Application Publication No. 2004-193581
[Patent Literature 2]
  Japanese Patent Application Publication No. 2000-11954

SUMMARY OF INVENTION

Technical Problem

As described above, a filter that incorporates neodymium oxide ($Nd_2O_3$) particles, a glass thin-film filter that incorporates neodymium ions (Nd3+), or similar, is useable for improving the color rendering index. However, this comes at a cost of light being absorbed in a specific wavelength band by the filter, which has the effect of reducing the luminous efficacy of the LED lamp. Today, LED lamps receive attention as energy-conscious light sources. Yet, constraining the reduction to luminous efficacy and improving the color rendering index may provide a new level of such energy-conscious products.

Thus, the present invention aims to provide an LED module, an LED lamp, and an illuminating apparatus that constrain reductions in luminous efficacy while improving the color rendering index.

Solution to Problem

The LED module pertaining to the present invention comprises: a blue LED; one or more varieties of phosphor particles, the particles being excited by outgoing light from the blue LED; and neodymium glass particles incorporating neodymium ions and absorbing light of a specific wavelength band in outgoing light from the phosphor particles.

The LED lamp pertaining to the present invention comprises: a blue LED; one or more varieties of phosphor particles excited by outgoing light from the blue LED; and neodymium glass particles incorporating neodymium ions and absorbing light of a specific wavelength band in outgoing light from the phosphor particles.

The illuminating apparatus pertaining to the present invention includes the above-described LED lamp and a fixture.

Advantageous Effects of Invention

According to the above, neodymium glass particles that incorporate neodymium ions are used as a filter that absorbs light of a specific wavelength band. Thus, decreased reduction in luminous efficacy and enhanced color rendering indices are obtained by using the neodymium glass particles as a filter, rather than using neodymium oxide ($Nd_2O_3$) particles or neodymium glass thin-film.

BRIEF DESCRIPTION OF DRAWINGS

FIG. 5 is a table listing various evaluation indices measured for the luminous efficacy and the color rendering index of the LED modules.

FIG. 7 is a table listing data for FIGS. 6A through 6D.

FIG. 10 is a table listing various evaluation indices measured for the luminous efficacy and color rendering of the LED modules.

FIG. 15 illustrates a further variant configuration for the LED lamp.

FIG. 16 illustrates the configuration of an illuminating apparatus.

DESCRIPTION OF EMBODIMENT

An Embodiment of the present invention is described below, with reference to the accompanying drawings.

(Configuration)

Figure 1:
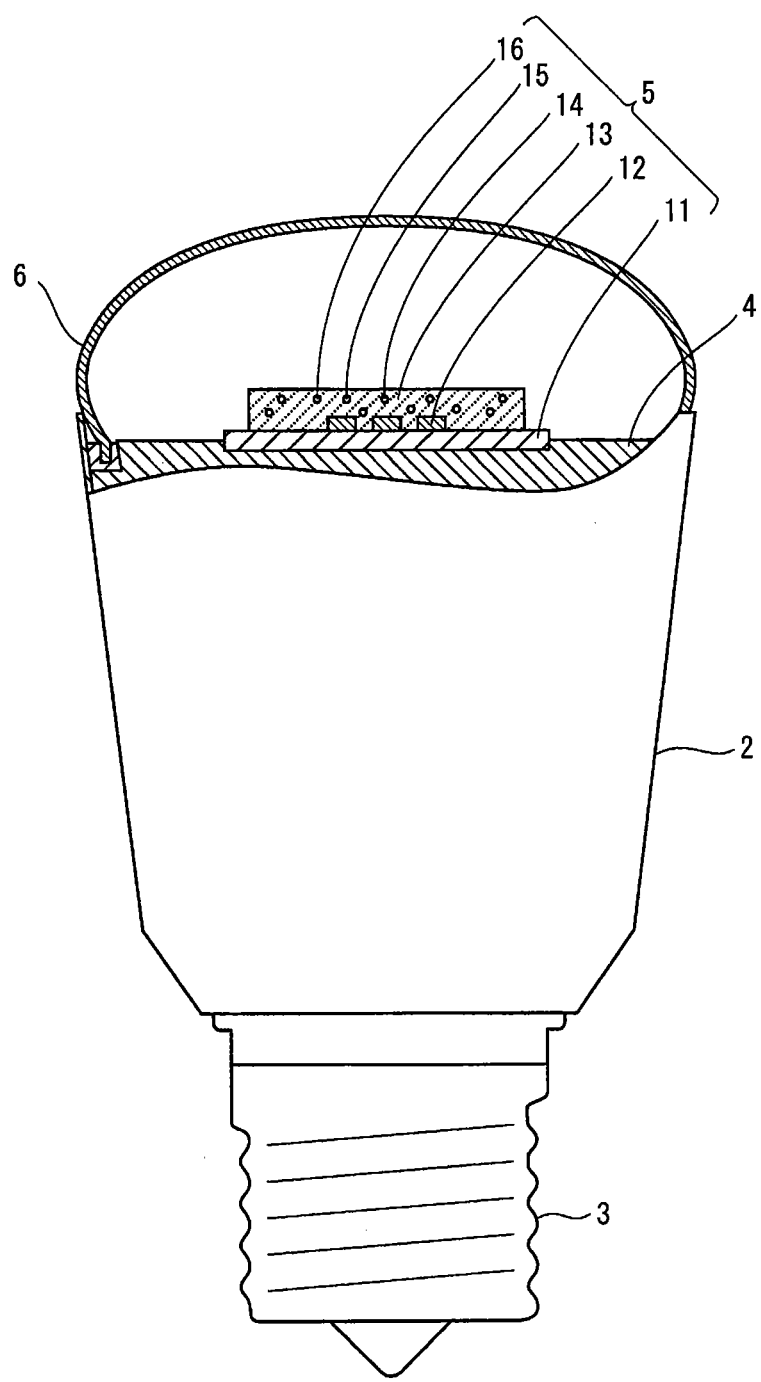
FIG. 1 is a partial cut-away diagram illustrating the configuration of an LED lamp pertaining to an Embodiment of the present invention.

FIG. 1 is a partial cut-away diagram illustrating the configuration of an LED lamp pertaining to the Embodiment of the present invention.

The LED lamp 1, notably shaped like a light bulb, is a replacement for an incandescent light bulb. A body 2 has an Edison screw serving as a base 3 attached to one end thereof. A far end 4 of the body 2 has an LED module 5 and a globe 6 attached thereto such that the latter covers the former.

The LED module 5 includes blue LEDs 12 mounted on a circuit board 11. The blue LEDs 12 are sealed in place by a translucent sealing element 13.

The sealing element 13 contains at least one variety of phosphor particle dispersed throughout. The phosphor particles are excited by the outgoing light from the blue LED. The variety of phosphor particles used is selected as appropriate, according to the color division to be realized by the LED lamp (e.g., incandescent, warm white, white, natural white, or daylight color). In the present Embodiment, the selected phosphor particles dispersed throughout the sealing element 13 are yellow-green phosphor particles 14 and red phosphor particles 15. However, no limitation is intended. The yellow-green phosphor particles 14 and the red phosphor particles 15 may also be selected alone, without the other variety. The diameter of the phosphor particles is approximately 30 μm. The phosphor particle diameter is measured by suspending the particles in water and using a laser diffraction particle size distribution measurement device on the solution thus obtained. Given that a laser diffraction particle size distribution is measured, the median diameter (d50) is used as the basis for the abundance ratio, as found on a volumetric basis (from a volumetric distribution). Also, the laser diffraction particle size distribution measurement device used was the SALD-2000A model manufactured by Shimadzu Corporation.

The sealing element 13 further contains neodymium glass particles 16, which incorporate neodymium ions. As such, the neodymium glass particles 16 are positioned so as to be illuminated by the light from the phosphor particles, thus absorbing the light from the phosphor particles in a specific wavelength band. The outgoing light from the blue LEDs 12, the yellow-green phosphor particles 14, and the red phosphor particles 15 unabsorbed by the neodymium glass particles 16 is ultimately emitted by the LED module 5. The neodymium glass particles 16 are obtained by pulverizing a plate of neodymium glass, and the particle diameter is between 10 and 200 μm, inclusive.

The specifics of each component are described below.

(1) Blue LEDs

The blue LEDs 12 produce light having a main peak in the 440 nm to 460 nm wavelength band. The LEDs may be, for example, GaN LEDs.

(2) Yellow-Green Phosphor Particles

The yellow-green phosphor particles 14 are excited by the outgoing light from the blue LEDs 12 so as to emit yellow-green light. Green phosphor particles have a main peak in the 500 nm to 540 nm wavelength band, while yellow phosphor particles have a main peak in the 545 nm to 595 nm wavelength band. Phosphor particles generally exhibit great variation. As a consequence, phosphor particles classified as yellow in terms of composition may be classified as green in terms of emission peak, and vice-versa. The two phenomena are not necessarily distinguishable. In the present document, the term "yellow-green phosphor particle" is applied for this reason.

The green phosphor may be any of the following: $Y_3Al_5O_{12}:Ce^{3+}$; $Tb_3Al_5O_{12}:Ce^{3+}$; $BaY_2SiAl_4O_{12}:Ce^{3+}$; $Ca_3Sc_2Si_3O_{12}:Ce^{3+}$; $(Ba, Sr)_2SiO_4:Eu^{2+}$; $CaSc_2O_4:Ce^{3+}$; $Ba_3Si_6O_{12}N_2:Eu^{2+}$; $\beta$-$SiAlON:Eu^{2+}$; and $SrGa_2S_4:Eu^{2+}$.

The yellow phosphor may be any of the following: $(Y, Gd)_3Al_5O_{12}:Ce^{3+}$; $Y_3Al_5O_{12}:Ce^{3+}:Pr^{3+}$; $(Tb, Gd)_3Al_5O_{12}:Ce^{3+}$; $(Sr, Ba)_2SiO_4:Eu^{2+}$; $(Sr, Ca)_2SiO_4:Eu^{2+}$; $CaSi_2O_2N_2:Eu^{2+}$; $Ca$-$\alpha$-$SiAlON:Eu^{2+}$; $Y_2Si_4N_6C:Ce^{3+}$; and $CaGa_2S_4:Eu^{2+}$.

(3) Red Phosphor Particles

The red phosphor particles 15 are excited by the outgoing light from at least one of the blue LEDs 12 and the yellow-green phosphor particles 14, and thus emit red light. The red phosphor particles 15 have a main peak in the 600 nm to 650 nm wavelength band.

The red phosphor may be any of the following: $Ca$-$\alpha$-$SiAlON:Eu^{2+}$; $CaAlSiN_3:Eu^{2+}$; $(Sr, Ca)AlSiN_3:Eu^{2+}$; $Sr_2Si_5N_8:Eu^{2+}$; $Sr_2(Si, Al)_5(N, O)_8:Eu^{2+}$; $CaS:Eu^{2+}$; and $La_2O_2S:Eu^{3+}$.

(4) Neodymium Glass Particles

Figure 2:
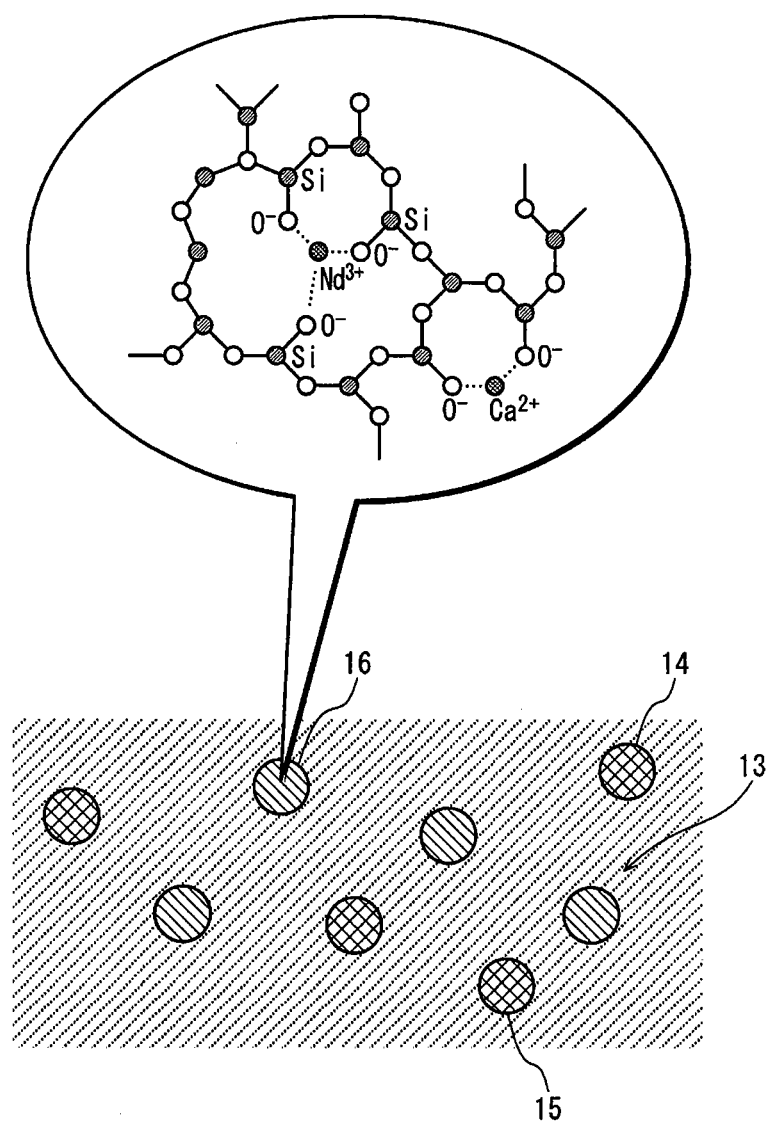
FIG. 2 is a schematic diagram of a sealing element in which yellow-green phosphor particles, red phosphor particles, and neodymium glass particles are dispersed, illustrating the ionized neodymium in the neodymium glass particles.

The neodymium glass particles 16 absorb the outgoing light from the phosphor particles of the sealing element in a specific wavelength band. Specifically, the neodymium glass particles 16 have a main absorption peak in the 580 nm to 600 nm wavelength band. This wavelength band is shorter than 605 nm, which is in the vicinity of the absorption peak of $Nd_2O_3$ particles. The absorption peak wavelength band of neodymium glass differs from that of neodymium oxide ($Nd_2O_3$) because, while neodymium ions ($Nd^{3+}$) are present in the former, the neodymium atoms of the latter are in covalent bonds with oxygen atoms and thus, not in ionized form. A gap between the excited energy level respectively reached by absorption is therefore believed to be present. FIG. 2 is a schematic diagram of the sealing element in which the yellow-green phosphor particles 14, the red phosphor particles 15, and the neodymium glass particles 16 are dispersed, illustrating the presence of ionized neodymium in the neodymium glass particles.

The neodymium glass is manufactured by mixing silica ($SiO_2$), alkali metal oxides, alkaline earth metal oxides, neodymium oxide ($Nd_2O_3$), and boron oxide ($B_2O_3$) at an appropriate weight ratio and fusing the compound so obtained. The alkali metal oxides may be any of $Na_2O$, $Li_2O$, $K_2O$, and the like. The alkaline earth metal oxides may be any of CaO, SrO, BaO, MgO, and the like.

The neodymium glass particles 16 should preferably make up 0.3% to 50% by weight of the sealing element, and most preferably make up 1.25% to 40% by weight thereof Experiments have shown that within this range, luminous efficacy reduction is inhibited while the color rendering index is improved. Also, increasing the weight ratio of the neodymium glass particles means correspondingly reducing the weight ratio of the sealing element, and the cohesion of the neodymium glass particles within the sealing material is accordingly reduced. This reduction poses no particular problem as long as the neodymium glass particles 16 make up no more than 50% by weight of the sealing element. The relative density of the neodymium glass particles is approximately 2, while that of the sealing element is approximately 1. Thus, for the neodymium glass particles, 50% by weight is only 30% by volume. Therefore, sufficient cohesion is maintained.

Also, the neodymium should preferably be 2% to 32% by weight of the neodymium glass particles 16, expressed in terms of oxides. Less than 2% neodymium content by weight leads to reduced light absorption by individual neodymium glass particles. More neodymium glass particles are therefore needed in the sealing element, which may lead to cracking at the sealing element surface. Also, more than 32% neodymium content by weight leads to the formation of neodymium particle clumps within the neodymium glass. Incidentally, for 32% neodymium content by weight, the glass is formed with 58% silica, 5% $Na_2O$, and 5% $B_2O_3$ content by weight.

(5) Sealing Element

The sealing element 13 protects the blue LEDs 12 from atmospheric dust and humidity. Also, in the present Embodiment, the sealing element 13 serves to fix the yellow-green phosphor particles 14, the red phosphor particles 15, and the neodymium glass particles 16 uniformly dispersed therein.

The material used for the sealing element 13 may be a silicone resin or similar, or may be a low-melting-point glass material. When silicone is used, the yellow-green phosphor particles 14, the red phosphor particles 15, and the neodymium glass particles 16 are first dispersed within the silicone material, and then the material is poured into a mould for solidification. Alternatively, when low-melting-point glass is used, a sol-gel process may be employed for manufacture. That is, 30 g of neodymium glass particles of 20 μm diameter are added to a solution made up of 20 cc tetraethylorthosilicate $Si(OC_2H_5)_4$, 80 cc of water, and 80 cc of ethanol. A few cubic centimetres of hydrochloric acid (or sulfuric acid, or acetic acid) at a concentration of 0.01 mol/dm$^3$ are then added to the mixture. This neodymium glass particle-containing mixture is gelated. The resulting gel is placed into a mould and dried for two hours at 100° C. After drying, the product is baked for one hour at 800° C. This results in neodymium glass particle-containing glass. A silicon alkoxide other than tetraethylorthosilicate may also be used. Thus, a low-melting-point glass may be made to incorporate the neodymium glass particles without melting, such that the particles retain their original external shape. The quantities of each liquid may be adjusted as appropriate to actual manufacturing conditions.

Using the above-described configuration, luminous efficacy reduction is inhibited while the color rendering index is improved relative to conventional technology. Conventionally, neodymium oxide particles (corresponding to Patent Literature 1) or neodymium glass plates (corresponding to Patent Literature 2) are used as the light-absorbing material.

In practice, the amount of light absorbed by the light-absorbing material may be made to vary between products (e.g., between incandescent-colored and daylight-colored products). In such circumstances, the above-described configuration requires only that the weight ratio of neodymium glass particles within the sealing element be adjusted. This simplifies material management during manufacture in comparison to the conventional scenario where neodymium glass plates are manufactured at different thicknesses for different products.

(Experimental Validation)

The inventors experimentally evaluated the luminous efficacy and the color rendering index of neodymium glass particles used as the light-absorbing material (corresponding to the present Embodiment) in comparison to equivalent use of neodymium oxide particles (corresponding to Patent Literature 1) and of neodymium glass plates (corresponding to Patent Literature 2). The experiment was performed using LED modules corresponding to the colors defined by Japanese Industrial Standard Z9112 as "incandescent" and "daylight".

(Incandescent)

Figure 3:
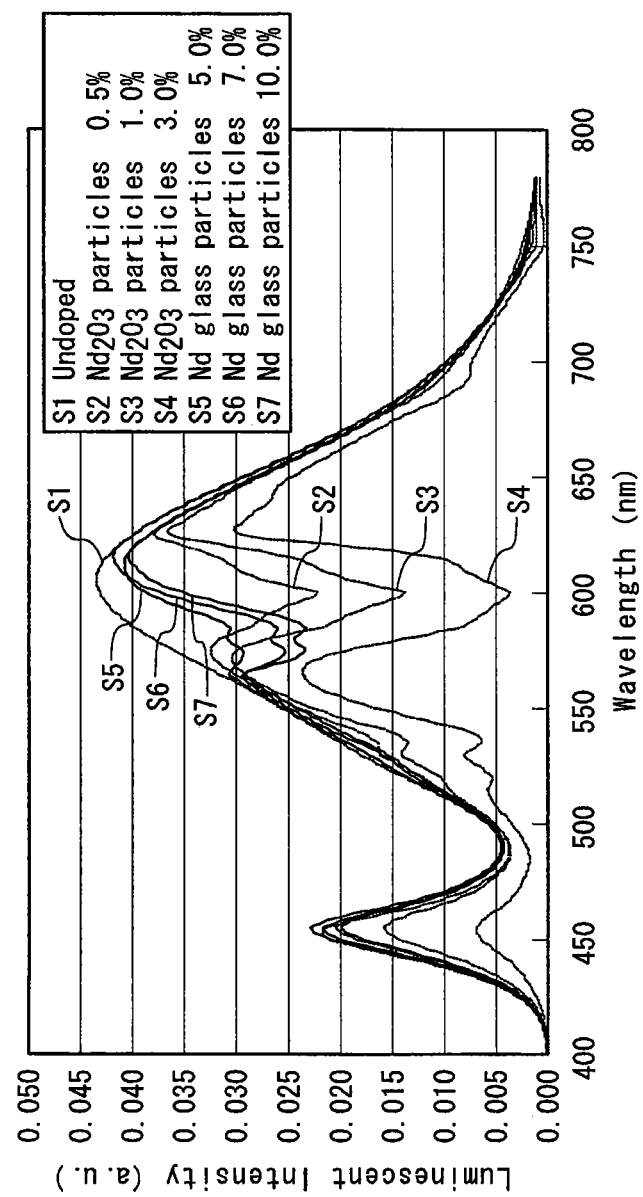
FIG. 3 is a graph indicating the results of spectrographic measurements performed on Comparative Samples S1 through S4 and on Embodiment Samples S5 through S7.
Figure 4:
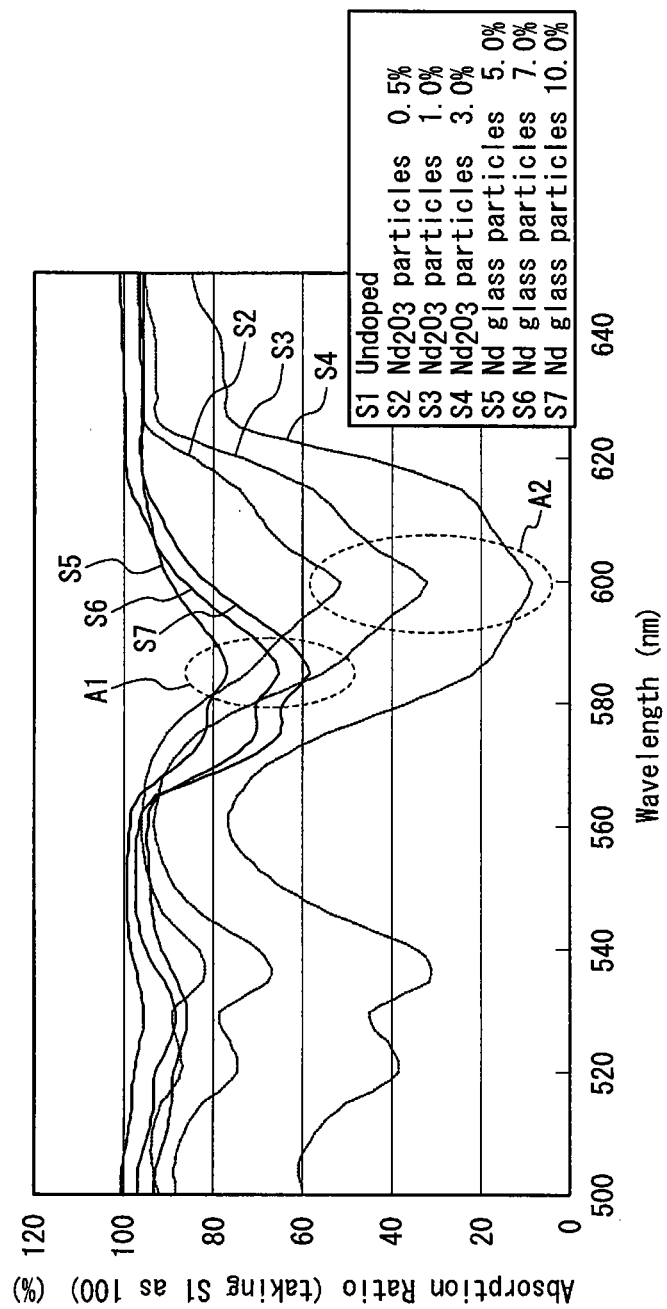
FIG. 4 is a graph indicating the luminescent intensity ratios of Comparative Samples S2 through S4 and on Embodiment Samples S5 through S7, with the luminescent intensity of Comparative Sample S1 set to 100.

First, the results of an experiment comparing neodymium glass particles to neodymium oxide particles are presented with reference to FIGS. 3 through 5. Second, the results of an experiment comparing neodymium glass particles to neodymium glass plates are presented with reference to FIGS. 6 through 8.

(1) Comparison: Neodymium Glass Particles and Neodymium Oxide Particles

FIG. 3 is a graph showing the results of spectrographic measurements performed on Comparative Samples S1 through S4 and on Embodiment Samples S5 through S7. Similarly, FIG. 4 is a graph showing the luminescent intensity of Comparative Samples S2 through S4 and of Embodiment Samples S5 through S7, where the luminescent intensity of Comparative Sample S1 is taken to be 100.

Comparative Sample S1 is an LED module in which only phosphor particles are dispersed in the sealing element (hereinafter termed undoped). Comparative Sample Si contains no light-absorbing material. Thus, the sample serves as a basis for evaluating the changes to luminous efficacy and to the color rendering index in samples containing light-absorbing material.

Comparative Samples S2, S3, and S4 are LED modules in which phosphor particles and neodymium oxide ($Nd_2O_3$) particles are dispersed throughout the sealing element. The neodymium oxide particles are, respectively, 0.5%, 1.0%, and 3.0% by weight of the sealing element contents. Here, the weight ratio refers to the fraction of neodymium oxide particle weight with respect to a total weight of 100 for the sealing element, phosphor particles, and neodymium oxide particles combined.

Embodiment Samples S5, S6, and S7 are LED modules in which phosphor particles and neodymium glass particles are dispersed throughout the sealing element. The neodymium oxide particles are, respectively, 5.0%, 7.0%, and 10.0% by weight of the sealing element contents. Here, the weight ratio refers to the fraction of neodymium glass particle weight with respect to a total weight of 100 for the sealing element, phosphor particles, and neodymium glass particles combined.

The correlated color temperature of the LED modules is in the vicinity of 2600 K for all samples. This corresponds to the color defined by Japanese Industrial Standard Z9112 as "incandescent".

The phosphor particles used were a combination of the yellow-green phosphor particles 14 and the red phosphor particles 15. The particle diameter was on the order of 30 μm for both varieties.

The neodymium glass particles were obtained by melting neodymium glass material at 1200° C. to form a plate of glass, annealing the glass plate for two hours at 1000° C. in nitrogen gas at a flow rate of 10 cc/min, and then pulverizing the resulting glass plate. The neodymium glass particles were measured as having a diameter on the order of 180 μm.

The neodymium glass material contains 65.6% silica ($SiO_2$) by weight, 15.9% alkali metal oxides ($Na_2O$, $Li_2O$, and $K_2O$) by weight, 10.6% alkaline earth metal oxides (CaO, SrO, BaO, and MgO) by weight, and 7.9% neodymium oxide ($Nd_2O_3$) by weight. The alkali metal oxides were equal parts $Na_2O$, $Li_2O$, and $K_2O$, and the alkaline earth metal oxides were also equal parts CaO, SrO, BaO, and MgO.

Silicone resin was used as the sealing element.

As FIG. 3 makes clear, the Comparative Samples S2 through S4 and the Embodiment Sample S5 through S7 absorb light in a specific wavelength band through the effect of the light-absorbing material. Also, the greater the weight ratio of the light-absorbing material in the sealing element, the higher the light absorption rate.

FIG. 4 indicates that Embodiment Samples S5 through S7 have an absorption peak in the vicinity of 580 nm (see area A1) while Comparative Samples S2 through S4 each have an absorption peak in the vicinity of 600 nm (see area A2). That is, the absorption peak of Embodiment Sample S5 through S7 is in a shorter-wavelength band than the absorption peak of Comparative Sample S2 through S4. As such, the absorption peak is shifted toward shorter wavelengths, enabling absorption the yellowest portion of the yellow wavelength band. Used in a lamp, an LED module made up of an LED and phosphor is prone to emphasizing the yellow elements of bright reds or of Japanese complexions when the light source produces overly intense light in the yellow wavelength band. This tends to be seen as poor color rendering. In comparison to Comparative Samples S2 through S4, Embodiment Samples S5 through S7 are able to absorb yellower light. In particular, this improves the color rendition of bright reds and of Japanese complexions, and, by extension, improves the color rendering indices of the LED lamp.

FIG. 5 is a table listing various luminous efficacy and color rendering indices measured for the LED modules. The indices are flux, flux ratio, average color rendering index Ra, color gamut surface ratio Ga, conspicuity index M, special color rendering indices R9 and R15, and color gamut surface ratio Ga4.

The flux ratio is a value obtained from the respective flux of each Comparative Sample S2 through S4 and Embodiment Sample S5 through S7, taking the flux of Comparative Sample S1 as a baseline. A higher flux ratio indicates less reduction of luminous efficacy by the light-absorbing material.

General color rendering index Ra is defined by Japanese Industrial Standard Z8726 and calculated according to eight test colors (mid-saturation test colors) numbered 1 through 8. The index evaluates whether mid-saturation colors appear natural.

Color gamut surface ratio Ga is described in the reference column of Japanese Industrial Standard Z8726 as an alternative method for evaluating color rendition, without using color rendering indices. Specifically, values are obtained as follows. First, chromaticity coordinates are obtained for each test color 1 through 8 under a reference light source and a test subject light source. The coordinates are plotted in the U*V* plane, and the surface area of each resulting octagon is calculated. The surface area of the test color octagon is then divided by that of the reference light octagon, and the resulting surface area ratio is multiplied by 100.

A color gamut surface ratio Ga value under 100 is indicative of decreased saturation and thus, of a tendency toward dull colors. In contrast, a color gamut surface ratio Ga value over 100 is indicative of increased saturation and thus, of a tendency toward vivid colors. Typically, the higher the saturation, the more the color of an object is considered pleasant. Thus, color gamut surface ratio Ga is a suitable index of color desirability.

Conspicuity index M is an index indicating the perceived conspicuity of a color. The degree of conspicuity of a color subject illuminated by the test subject light source is expressed by the color gamut surface area of a four-color test subject. Here, the color system used is the brightness (B) and colorfulness (Mr-g and My-b) of a non-linear color-appearance model proposed by Nayatani et al. (see, for example, in Color Research & Application, Vol. 20, Issue 3, 1995). The conspicuity index M is calculated as follows, using the color gamut surface area found for the four-color test subject.

$$M=[G(S, 1000)/G(D65, 1000)]^{1.6} \times 100$$

where G(S, 1000) represents the color gamut surface area of the four-color test subject illuminated by the test subject light source at 1000 lx, and G (D65, 1000) represents the color gamut surface area of the four-color test subject illuminated by the reference light source D65 at 1000 lx. The higher the conspicuity index M, the more conspicuous colors, such as those of flowers or foliage, appear.

Special color rendering index R9 was calculated according to test color No. 9 (bright red) defined by Japanese Industrial Standard Z8726. Similarly, special color rendering index R15 was calculated according to test color No. 15 (Japanese complexion) defined by Japanese Industrial Standard Z8726.

Color gamut surface ratio Ga4 was calculated for four test colors No. 9 through 14 (high-saturation test colors). The method used to calculate Ga for test colors No. 1 through 8 was again used to obtain results for test colors No. 9 through 12. Test colors No. 1 through 8 are mid-saturation colors selected in order to evaluate slight differences in the appearance of natural objects. In contrast, test colors No. 9 through 12 are high-saturation colors selected in order to evaluate vividly colored objects. Therefore, Ga4 enables correct evaluation of whether an object intended to appear vivid correctly appears as such.

FIG. 5 reveals that the Comparative Sample and Embodiment Sample with the closest flux ratios are Comparative Sample S2 and Embodiment Sample S7. This flux ratio closeness signifies that the samples exhibit similar degrees of luminous efficacy reduction, which is due to the light-absorbing material.

For Comparative Sample S2, average color rendering index Ra is 81.6, color gamut surface ratio Ga is 99.6, conspicuity index M is 119.0, special color rendering index R9 is 54.3, special color rendering index R15 is 85.0, and color gamut surface ratio Ga4 is 102.1.

For Embodiment Sample S7, average color rendering index Ra is 87.5, color gamut surface ratio Ga is 103.5, conspicuity index M is 124.0, special color rendering index R9 is 51.6, special color rendering index R15 is 91.3, and color gamut surface ratio Ga4 is 103.1.

It follows that Embodiment Sample S7 is superior to Comparative Sample S2 in terms of five indices, namely average color rendering index Ra, color gamut surface ratio Ga, conspicuity index M, special color rendering index R15, and color gamut surface ratio Ga4. While Embodiment Sample S7 is inferior to Comparative Sample S2 in terms of special color rendering index R9, this is thought to be due to the fact that the flux ratios are not quite equal. The special color rendition index R9 value of Embodiment Sample S7 would be expected to equal or exceed that of Comparative Sample S2 if the flux ratios of the two samples were made to match by increasing the neodymium glass particle weight ratio in Embodiment Sample S7.

Accordingly, the use of neodymium glass particles rather than neodymium oxide particles as the light-absorbing material is clearly linked to luminous efficacy reduction being inhibited while the color rendering index is improved.

Let the weight ratio of the neodymium glass particles in the sealing element be R1, let the weight ratio of neodymium (in terms of oxides) in the neodymium glass particles be R2, and let the weight ratio of neodymium (in terms of oxides) in the sealing element be R3. Thus, $R3=R1 \times R2 \times 100$. In the above-described experiment, R1 is 5.0% to 10.0% and R2 is 7.9%. Thus, R3 is 0.4% to 0.8%. All of the above are given by weight. As a rule, the same results are expected for the same weight ratio of neodymium in the sealing element. Accordingly, the results expected for 0.4% to 0.8% by weight neodymium content in the sealing element, in terms of oxides, are the inhibition of luminous efficacy reduction and improvement of the color rendering index.

Furthermore, in the above-described experiment, R2 is 7.9% by weight. However, as explained, R2 is freely variable within a range of 2% to 32% by weight. By back analysis, when R2 is 2% to 32% by weight and R3 is 0.4% to 0.8% by weight, then the weight ratio R1 of the neodymium glass particles in the sealing element is variable within a range of 1.25% to 40% by weight.

Also, while R3 is 0.4% to 0.8% by weight in the above experiment, manufacturing error considerations result in a range of 0.1% to 1% by weight. Again by back calculation, the weight ratio R1 of neodymium glass particles in the sealing element is variable within a range of 0.3% to 50% by weight.

(2) Comparison: Neodymium Glass Particles and Neodymium Glass Plates

Figure 6A:
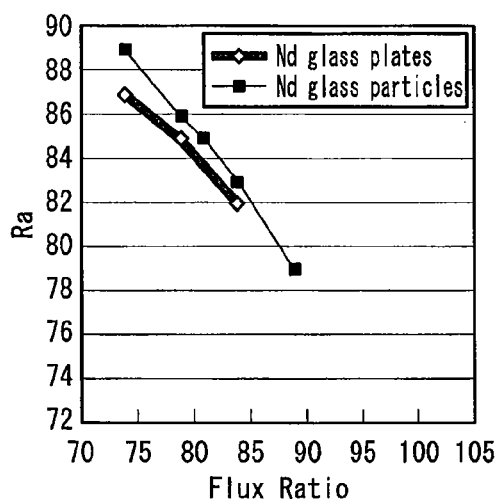
FIGS. 6A through 6D are graphs illustrating the relationship between the flux ratio and the various color rendering indices, where FIG. 6A concerns average color rendering index Ra, FIG. 6B concerns special color rendering index R9, FIG. 6C concerns special color rendering index R15, and FIG. 6D concerns color gamut surface ratio Ga4.
Figure 6B:
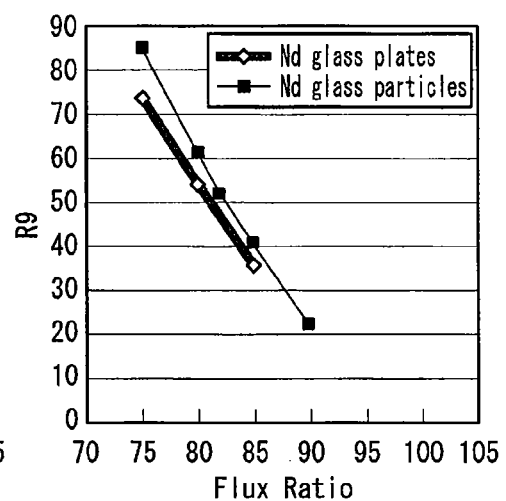
Figure 6C:
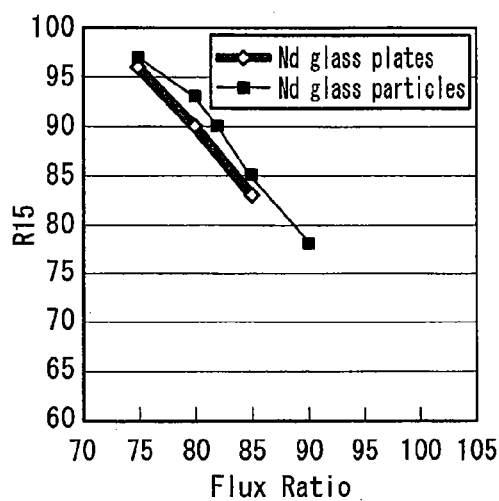
Figure 6D:
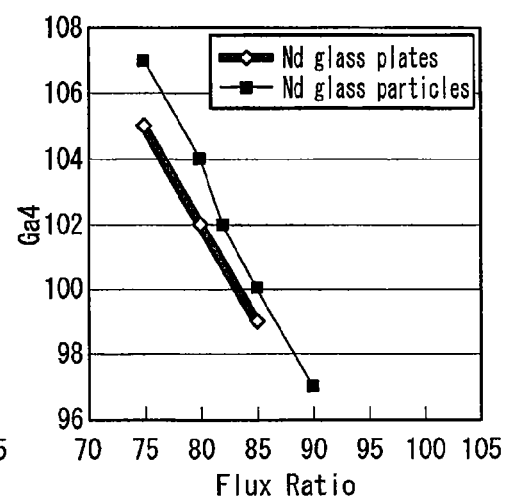

FIGS. 6A through 6D are graphs illustrating the relationship between the flux ratio and the various color rendering indices. FIG. 6A concerns average color rendering index Ra, FIG. 6B concerns special color rendering index R9, FIG. 6C concerns special color rendering index R15, and FIG. 6D concerns color gamut surface ratio Ga4. FIG. 7 lists the data for FIGS. 6A through 6D. In FIG. 7, Tc is the correlated color temperature and duv is the deviation.

As shown in FIGS. 6A through 6D, a line joining the data points for neodymium glass particles indicates a higher flux ratio than a line joining the data points for neodymium glass plates. This is true for average color rendering index Ra, for special color rendering indices R9 and R15, and for color gamut surface ratio Ga4. This signifies that neodymium glass particles provide a better color rendering index than neodymium glass plates at the same luminous efficacy.

Further, the slope of the line joining the data points of the neodymium glass particles is greater than the slope of the line joining the data points of the neodymium glass plates for average color rendering index Ra, for special color rendering index R9, and for color gamut surface ratio Ga4. This signifies that the neodymium glass particles can be used to provide a better color rendering index than neodymium glass plates while only causing slight reductions in luminous efficacy.

Accordingly, the use of neodymium glass particles rather than neodymium glass plates as the light-absorbing material is clearly linked to luminous efficacy reduction being inhibited while the color rendering index is improved.

The neodymium glass particles and neodymium glass plates have identical compositions, differing only in external shape. The experimenters experimentally determined, for the first time, that the above-described results can be obtained through simple shape variation.

Figure 8:
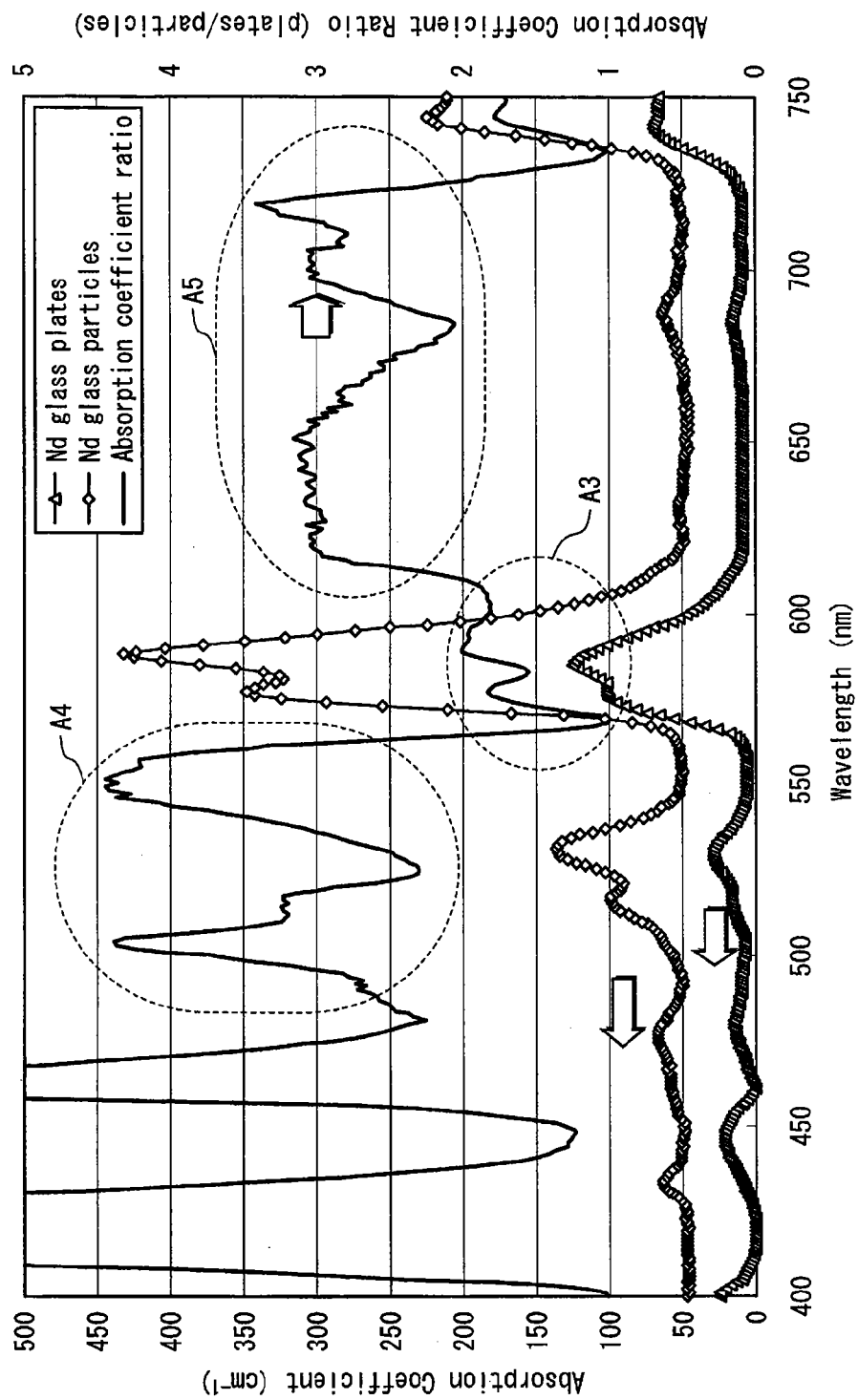
FIG. 8 is a graph indicating the results of measuring an absorption coefficient for the neodymium glass particles, measuring an absorption coefficient for the neodymium glass plates, and calculating an absorption coefficient ratio from the two.

FIG. 8 is a graph indicating the results of measuring an absorption coefficient for the neodymium glass particles, measuring an absorption coefficient for the neodymium glass plates, and calculating an absorption coefficient ratio from the two. The absorption coefficient ratio is a value obtained by dividing the absorption coefficient for the neodymium glass plates by the absorption coefficient for the neodymium glass particles.

A glance at the absorption coefficients reveals that the absorption peak wavelength band of the neodymium glass particles occurs at shorter wavelengths than that of the neodymium glass plates. As such, the absorption peak is shifted toward shorter wavelengths, enabling absorption of the yellowest wavelength band. This plausibly improves the color rendering index of the LED lamp.

Similarly, the absorption coefficient ratio line reveals that, while the ratio is on the order of 1 to 2 in the wavelength band of the absorption peak (see area A3), the ratio is on the order of 2 to 4 at shorter wavelengths (see area A4) and at longer wavelengths (see area A5). That is, in contrast to the neodymium glass plates, the neodymium glass particles have a relatively low absorption ratio at wavelengths outside the wavelength band of the absorption peak. Accordingly, and in contrast to the neodymium glass plates, the neodymium glass particles do not cause excess absorption in wavelengths other than the wavelength band of the absorption peak, thus exhibiting less luminous efficacy reduction.

Therefore, the difference in absorption results found between a single neodymium glass material in particulate and in plate form is thought to be due to optical path differences. For the plate form, the outgoing light from the phosphor particles passes through air (refractive index n=1) to irradiate the neodymium glass plates (refractive index n=1.7). Thus, the large difference in refractive index easily leads to a decreased rate of incident light on the glass plates. In contrast, for the particulate form, the outgoing light from the phosphor particles passes through the sealing element (refractive index n=1.4 for resin) to irradiate the neodymium glass particles (refractive index n=1.7). This leads to a higher rate of incident light on the neodymium glass particles.

Mixing the neodymium glass particles into the sealing element is also simpler than using glass plates, in terms of manufacturing.

(Daylight)

The structure of the LED modules used in the experiment was identical to that used for the incandescent color, differing only in that the correlated color temperature was set to 5200 K and that only yellow-green phosphor particles were used.

Figure 9:
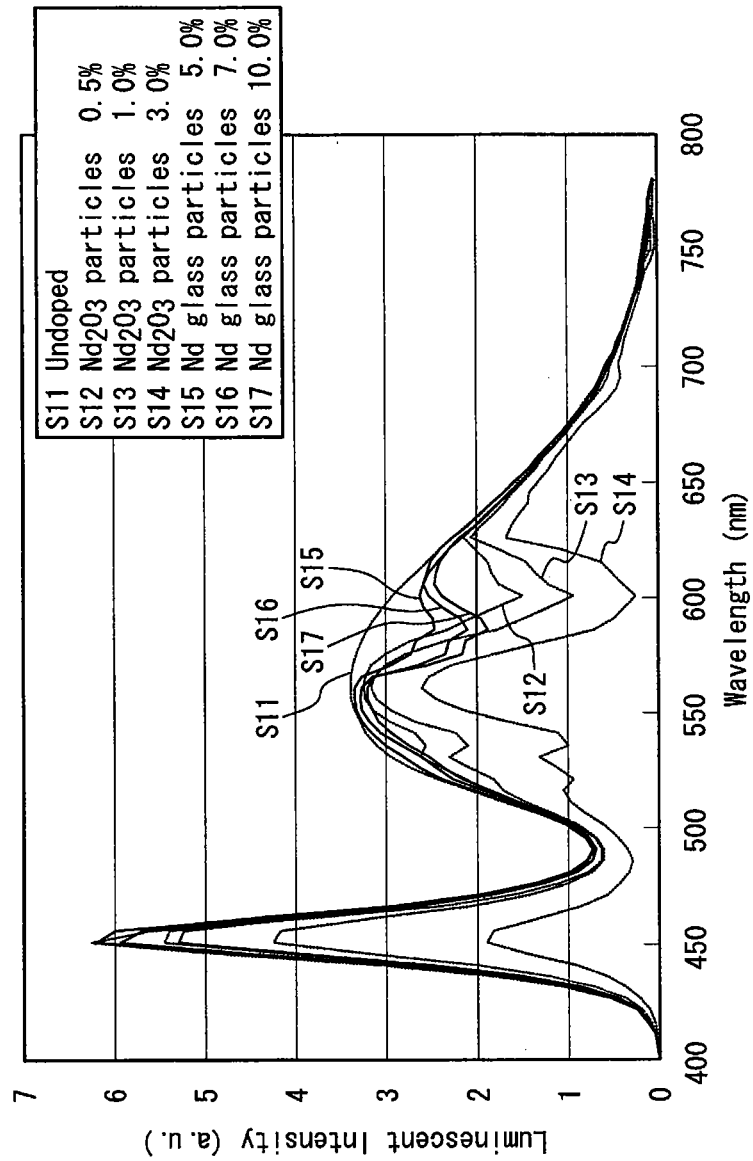
FIG. 9 is a graph indicating the results of spectrographic measurements performed on Comparative Samples S11 through S14 and on Embodiment Samples S15 through S17.

FIG. 9 is a graph indicating the results of spectrographic measurements performed on Comparative Samples S11 through S14 and on Embodiment Samples S15 through S17. FIG. 10 is a table listing various luminous efficacy and color rendering indices measured for the LED modules.

FIG. 9 indicates that the Comparative Sample and Embodiment Sample with the closest flux ratios are Comparative Sample S12 and Embodiment Sample S17.

For Comparative Sample S12, average color rendering index Ra is 76.2, color gamut surface ratio Ga is 92.5, conspicuity index M is 95.9, special color rendering index R9 is 39.7, special color rendering index R15 is 79.5, and color gamut surface ratio Ga4 is 97.3.

For Embodiment Sample S17, average color rendering index Ra is 86.5, color gamut surface ratio Ga is 98.6, conspicuity index M is 102.6, special color rendering index R9 is 57.0, special color rendering index R15 is 91.4, and color gamut surface ratio Ga4 is 101.3.

It follows that Embodiment Sample S17 is superior to Comparative Sample S12 in all indices, namely average color rendering index Ra, color gamut surface ratio Ga, conspicuity index M, special color rendering indices R9 and R15, and color gamut surface ratio Ga4.

Accordingly, the use of neodymium glass particles rather than neodymium oxide particles as the light-absorbing material is clearly linked to luminous efficacy reduction being inhibited while the color rendering index is improved.
(Variations)
(1) The Embodiment describes the configuration of an LED module. However, the present invention is not limited in this manner. The following variations are also possible.

Figure 11:
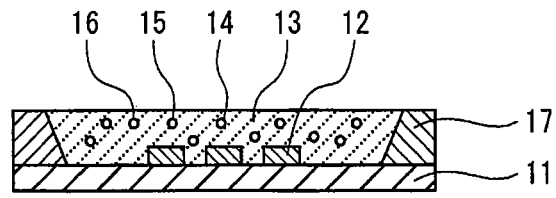
FIG. 11 illustrates variant configurations for the LED module.
Figure 11:
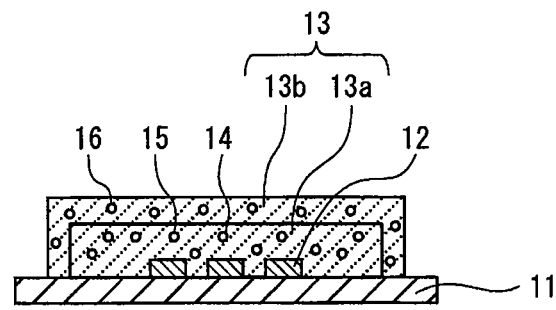
Figure 11:
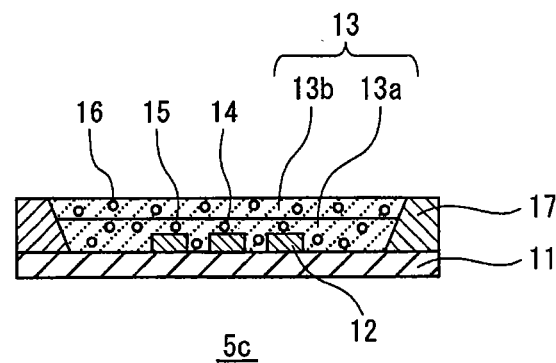

FIG. 11 illustrates variant configurations for the LED module.

LED module 5a has an annular reflector element 17 with a reflective inner face disposed on the circuit board 11. According to this configuration, light dispersed toward the sides is reflected by the reflective face toward the front. Consequently, the intensity of light is increased at the front of the LED lamp.

LED module 5b has a sealing element 13 made up of an inner layer 13a and an outer layer 13b. The yellow-green phosphor particles 14 and the red phosphor particles 15 are dispersed throughout the inner layer 13a, while the neodymium glass particles 16 are dispersed throughout the outer layer 13b. The absorption peak of the neodymium glass particles 16 is not in the wavelength band of the outgoing light from the blue LEDs 12, but rather in the wavelength band of the outgoing light from the phosphor particles. As such, the neodymium glass particles 16 are preferentially arranged such that the outgoing light from the phosphor particles passes therethrough, as other arrangements are less efficient. According to the above configuration, the neodymium glass particles 16 are arranged more efficiently.

LED module 5c is a combination of LED modules 5a and 5b.
(2) The Embodiment describes the configuration of an LED lamp. However, the present invention is not limited in this manner. Any configuration is permissible, provided that the phosphor particles are arranged so as to be irradiated by the outgoing light from the blue LEDs, and that the neodymium glass particles are provided so as to be irradiated by the outgoing light from the phosphor particles. For example, the following variations are possible.

Figure 12:
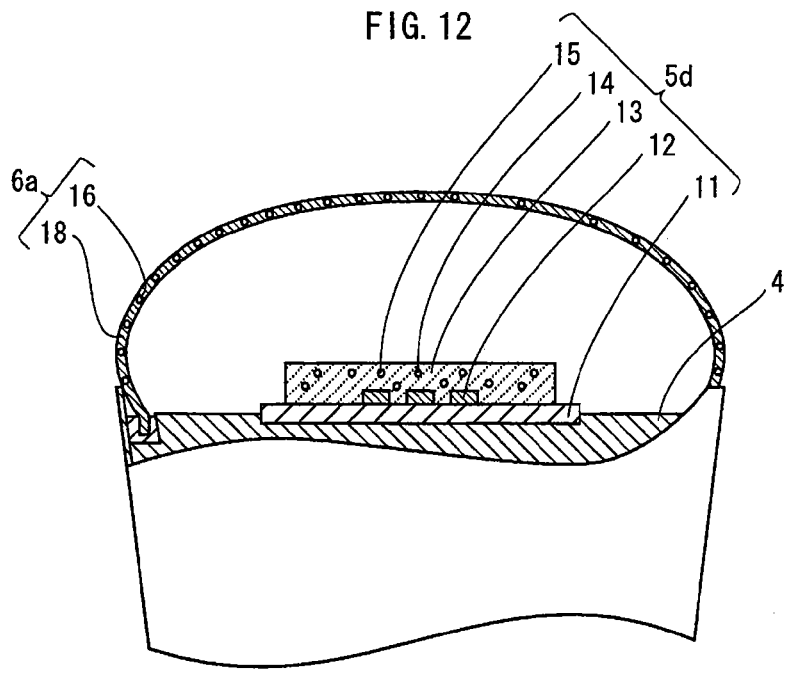
FIG. 12 illustrates variant configurations for the LED lamp.
Figure 12:
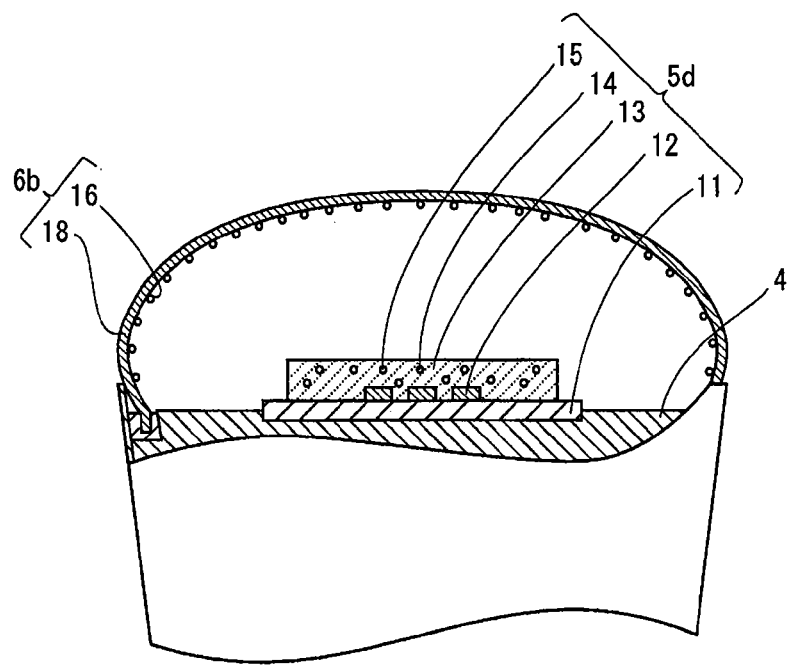
Figure 13:
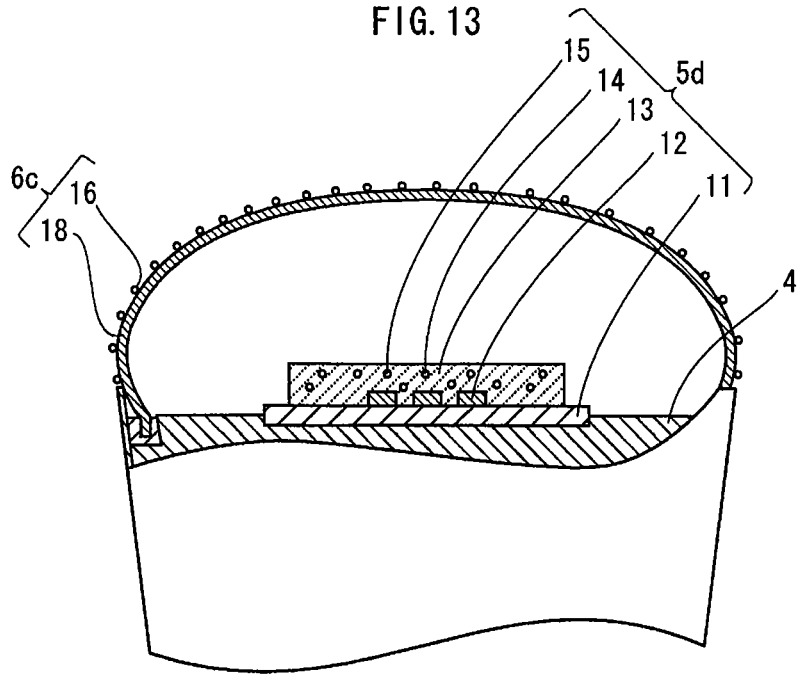
FIG. 13 also illustrates variant configurations for the LED lamp.
Figure 13:
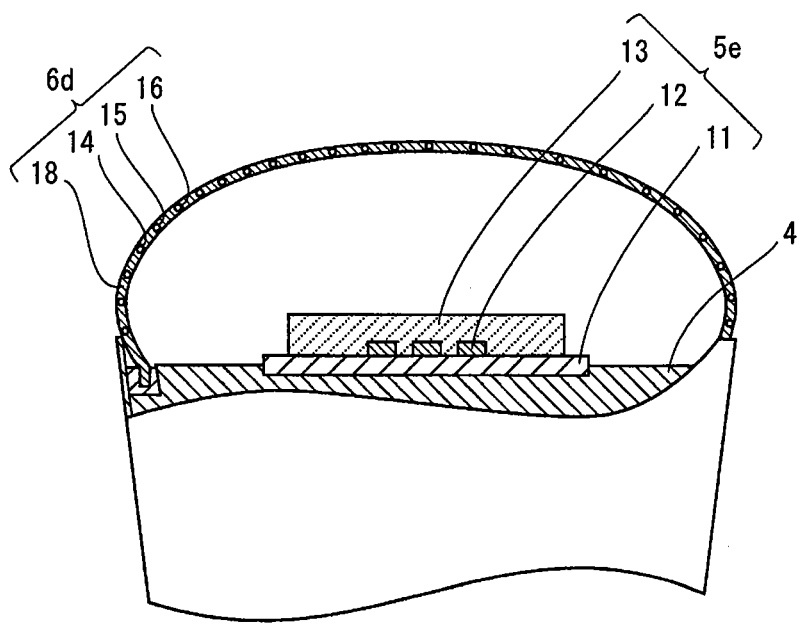
Figure 14:
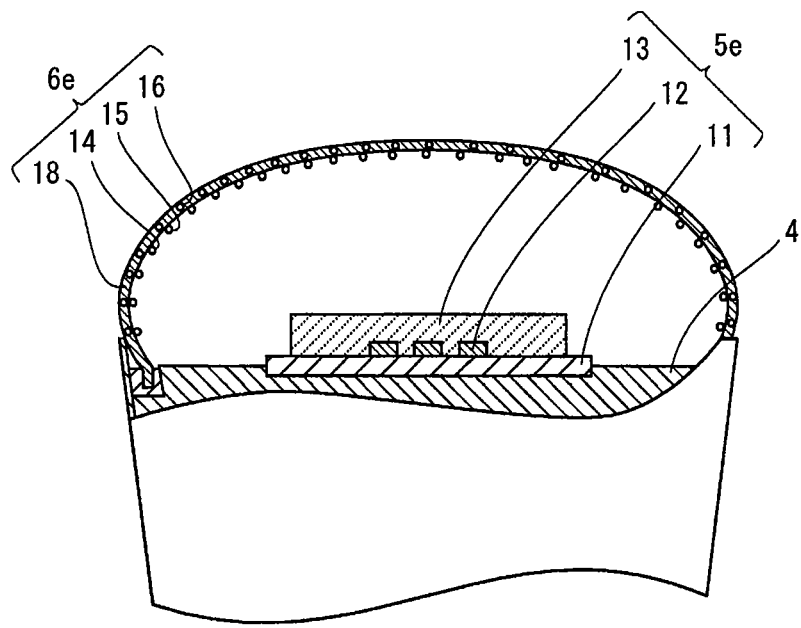
FIG. 14 also illustrates variant configurations for the LED lamp.
Figure 14:
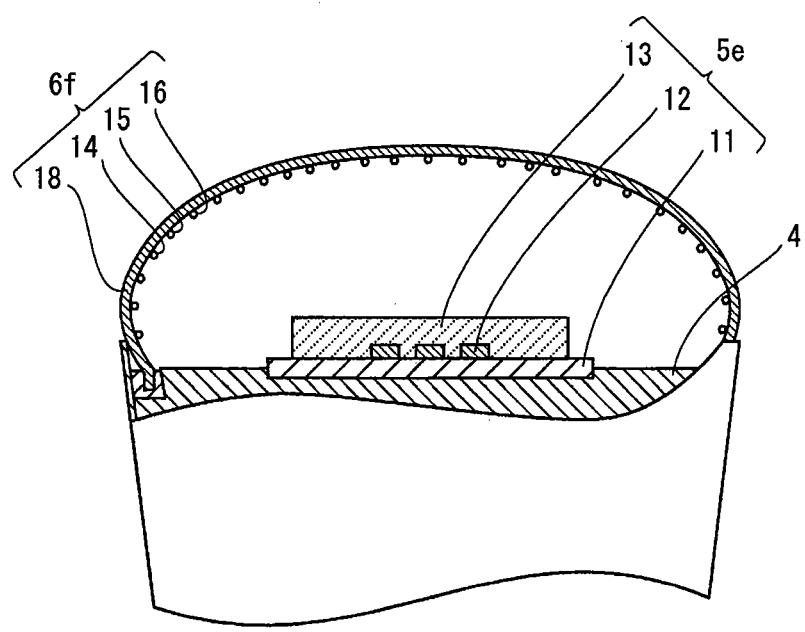

FIGS. 12, 13, and 14 illustrate variant configurations of the LED lamp.

In LED lamp 1a, the yellow-green phosphor particles 14 and the red phosphor particles 15 are dispersed throughout the sealing element 13 of an LED module 5d, while the neodymium glass particles 16 are dispersed throughout a transparent base material 18 of globe 6a.

In LED lamp 1b, the neodymium glass particles 16 adhere to the inner surface of the transparent base material 18 of globe 6b. The manufacturing process form globe 6b may be as followed.

When the base material 18 uses an acrylic resin or similar, the base material 18 is first mixed and molded (at a melting temperature on the order of 300° C.). Once the resin has melted, the neodymium glass particles 16 are dispersed into the resulting liquid for application. As such, a portion of the base material 18 surface is melted by the liquid, and solidifies with the neodymium glass particles 16 firmly sunk therein. Alternatively, the base material 18 may be molded and the neodymium glass particles 16 applied via a binder composed of the same type of resin.

When the base material 18 uses glass, the base material 18 mixed and formed (at a low melting point 600° C. or lower). The neodymium glass particles 16 are then thermally sprayed to adhere to the base material 18 surface.

In LED lamp 1c, the neodymium glass particles 16 adhere to the outer surface of the transparent base material 18 of globe 6c.

In LED lamp 1d, neither the phosphor particles nor the neodymium glass particles are found within the sealing element 13 of LED module 5e. Instead, the yellow-green phosphor particles 14, the red phosphor particles 15, and the neodymium glass particles 16 are dispersed throughout the transparent base material 18 of globe 6d.

In LED lamp 1e, the yellow-green phosphor particles 14 and the red phosphor particles 15 adhere to the inner face of the transparent base material 18 of globe 6e, while the neodymium glass particles 16 are dispersed throughout the base material 18. The phosphor particles and the neodymium glass particles may be made to adhere using the same method.

In LED lamp 1f, the yellow-green phosphor particles 14, the red phosphor particles 15, and the neodymium glass particles 16 all adhere to the inner face of the transparent base material 18 of globe 6f.

Also, the phosphor particles and the neodymium glass particles may be dispersed throughout another element, distinct from the sealing element and globe.
(3) In the Embodiment, the LED lamp is described as a light bulb. However, the present invention is not limited in this manner. For example, the following variations are possible.

FIG. 15 illustrates a variant configuration of the LED lamp. LED lamp 1g illustrates a replacement for a straight tube fluorescent lamp. A plurality of LED modules 5 are aligned inside a straight glass tube 7. A base 8 is provided at both ends of the glass tube 7 so as to receive electric power supplied to the LED modules 5.
(4) Although the Embodiment describes only an LED lamp, the lamp may also be combined with light fixtures for use as an illuminating apparatus.

FIG. 16 illustrates the configuration of an illuminating apparatus. An illuminating apparatus 20 includes the LED lamp 1 and a light fixture 21. The fixture 21 includes a cyathiform reflector 22 and a socket 23. The base 3 of the LED lamp base is screwed into the socket 23.

INDUSTRIAL APPLICABILITY

The present invention is applicable to general lighting and the like.

REFERENCE SIGNS LIST 1, 1a, 1b, 1c, 1d, 1e, 1f, 1g LED lamp
2 Body
3 Base
4 Far end of body
5, 5a, 5b, 5c, 5d, 5e LED module
6, 6a, 6b, 6c, 6d, 6f Globe
7 Glass tube
8 Base
11 Circuit board
12 Blue LED
13 Sealing element
13a Inner layer
13b Outer layer
14 Yellow-green phosphor particles
15 Red phosphor particles
16 Neodymium glass particles 17 Reflective element
18 Base material
20 Illuminating apparatus
21 Light fixture
22 Reflector
23 Socket

The invention claimed is:

1. An LED module comprising:
a blue LED;
one or more varieties of phosphor particles, the particles being excited by outgoing light from the blue LED; and
neodymium glass particles of neodymium glass having an amorphous structure incorporating neodymium in neodymium ion form for absorbing light of a specific wavelength band in outgoing light from the phosphor particles.

2. The LED module of claim 1, further comprising:
a transparent sealing element sealing the blue LED, wherein
the neodymium glass particles are dispersed throughout the sealing element.

3. The LED module of claim 2, wherein
the phosphor particles are also dispersed throughout the sealing element.

4. The LED module of claim 3, wherein
the neodymium glass particles make up 0.3% to 50% by weight of the sealing element.

5. The LED module of claim 4, wherein
the neodymium glass particles contain 2% to 32% by weight neodymium, in terms of oxides.

6. The LED module of claim 1, wherein the neodymium glass particles have a particle diameter of 10 μm to 200 μm.

7. The LED module of claim 1, wherein
the one or more varieties of phosphor particles include phosphor particles emitting yellow light.

8. The LED module of claim 1,
wherein the one or more varieties of phosphor particles include phosphor particles emitting yellow-green light and phosphor particles emitting red light.

9. The LED module of claim 1, further comprising:
a transparent sealing element sealing the blue LED, wherein
the neodymium glass particles are dispersed throughout the sealing element, and
the sealing element is manufactured from a silicon alkoxide that includes tetraethylorthosilicate and has the neodymium glass particles added thereto.

10. The LED module of claim 1, further comprising:
a transparent sealing element sealing the blue LED, wherein
the neodymium glass particles and the phosphor particles are dispersed throughout the sealing element, and as a result of manufacture using a sol-gel method, the sealing element contains a mixture of the neodymium glass particles and the phosphor particles.

11. An LED lamp comprising:
a blue LED;
one or more varieties of phosphor particles excited by outgoing light from the blue LED;
neodymium glass particles of neodymium glass having an amorphous structure incorporating neodymium in neodymium ion form for absorbing light of a specific wavelength band in outgoing light from the phosphor particles; and
a transparent member extending over the blue LED.

12. The LED lamp of claim 11, further comprising:
the transparent member is a transparent globe covering the blue LED, wherein
the neodymium glass particles either (i) adhere to an outer face or to an inner face of the globe, or (ii) are dispersed in the globe.

13. The LED lamp of claim 12,
the phosphor particles also either (i) adhere to the outer face or to the inner face of the globe, or (ii) are dispersed in the globe.

14. The LED lamp of claim 13, wherein
the neodymium glass particles make up 0.3% to 50% by weight of the sealing element.

15. The LED lamp of claim 14, wherein
the neodymium glass particles contains 2% to 32% by weight neodymium, in terms of oxides.

16. The LED lamp of claim 11, wherein
the neodymium glass particles have a particle diameter of 10 μm to 200 μm.

17. The LED lamp of claim 11, wherein
the one or more varieties of phosphor particles include phosphor particles emitting yellow light.

18. The LED lamp of claim 11, wherein
the one or more varieties of phosphor particles include phosphor particles emitting yellow-green light and phosphor particles emitting red light.

19. An illuminating apparatus comprising the LED lamp of claim 11 and a light fixture.

20. The LED module of claim 1, wherein
the neodymium glass particles further incorporate silicon and a metal, the metal being an alkali metal and/or an alkali earth metal.

21. The LED module of claim 20, wherein
the neodymium glass particles further incorporate boron.

22. The LED module of claim 1, wherein
the neodymium ions are $Nd^{3+}$ ions.

* * * * *